US005923947A

United States Patent [19]

Sur

[11] Patent Number: 5,923,947

[45] Date of Patent: Jul. 13, 1999

[54] METHOD FOR ACHIEVING LOW CAPACITANCE DIFFUSION PATTERN FILLING

[75] Inventor: Harlan Sur, San Leandro, Calif.

[73] Assignee: VLSI Technology, Inc., San Jose, Calif.

[21] Appl. No.: 08/851,842

[22] Filed: May 6, 1997

[51] Int. Cl.$^{6}$ .......... G01R 31/26; H01L 21/66

[52] U.S. Cl. .......... 438/17; 438/14; 438/16; 438/18

[58] Field of Search .......... 438/17, 16, 18, 438/118, 462, 23, 14

[56] References Cited

U.S. PATENT DOCUMENTS

| | | | |
|---|---|---|---|
| 5,037,771 | 8/1991 | Lipp | 438/18 |
| 5,104,823 | 4/1992 | Mand | 438/23 |
| 5,256,564 | 10/1993 | Narita | 438/462 |
| 5,434,089 | 7/1995 | Barthez | 438/17 |
| 5,462,882 | 10/1995 | Chisholm et al. | 438/118 |
| 5,627,083 | 5/1997 | Tounai | 438/18 |
| 5,663,076 | 9/1997 | Rostoker et al. | 438/14 |

*Primary Examiner*—Kevin M. Picardat
*Assistant Examiner*—Deven Collins
*Attorney, Agent, or Firm*—Wagner,Murabito&Hao

[57] ABSTRACT

An automated method for selectively locating fill pattern diffusion regions on a semiconductor substrate. In one embodiment, the present invention determines the locations of active diffusion regions on a semiconductor substrate. The present invention also determines the locations of interconnect lines on the semiconductor substrate. Next, the present invention creates a union of the location of the active diffusion regions on the semiconductor substrate and the location of the interconnect lines on the semiconductor substrate. The present invention uses this union to define allowable locations for placement of fill pattern diffusion regions on the semiconductor substrate such that the fill pattern diffusion regions are not disposed under the interconnect lines.

8 Claims, 7 Drawing Sheets

58 Poly 50 62 56 62 (Diffusion) Trench Oxide (Diffusion) Si

METHOD FOR ACHIEVING LOW CAPACITANCE DIFFUSION PATTERN FILLING

TECHNICAL FIELD

The present claimed invention relates to the field of semiconductor devices. More specifically, the present claimed invention relates to diffusion pattern filling on semiconductor substrates.

BACKGROUND ART

During the formation of semiconductor devices, variations in diffusion pattern density can occur. That is, the diffusion or active regions may not be evenly spaced about the semiconductor substrate. Such uneven spacing of the diffusion or active regions causes variations in planarization rates. More specifically, diffusion regions are commonly covered by nitride which acts as a stop during subsequent planarization steps. Thus, during, for example, chemical mechanical polishing or resist etch back steps, the planarization process etches or polishes through overlying layers such as, for example, an oxide layer until the underlying nitride layer is reached. When nitride covered diffusion regions are separated by large distances, areas disposed between the nitride covered diffusion regions may be etched or polished more deeply than the areas disposed directly above the nitride covered diffusion regions. Such a condition is commonly referred to as dishing or cusping. Similarly, when an uneven diffusion pattern density exists, oxide may deleteriously remain on the nitride layer after planarization steps. In order to prevent such planarization problems, fill pattern diffusion regions or "dummy diffusion patterns" are sometimes formed into the semiconductor substrate. The fill pattern diffusion regions 5 are not used to form active semiconductor devices, but are, instead used to achieve a more even or consistent diffusion pattern density. Unfortunately, conventional fill pattern diffusion region locating methods have significant drawbacks associated therewith.

With reference now to Prior Art FIG. 1A, a schematic top plan view of a portion 10 of a semiconductor substrate having active diffusion regions 12 and 14 formed therein is shown. In Prior Art FIG. 1A, diffusion regions 12 and 14 are separated by oxide 16. Oxide 16 is formed or deposited into the semiconductor substrate by, for example, a shallow trench isolation process. It will be understood that during various processing steps, active diffusion regions 12 and 14 are covered by a layer of nitride. As shown in Prior Art FIG. 1A, portion 10 of the semiconductor substrate is not consistently or evenly covered by diffusion regions. For example, portion 10 of the semiconductor substrate has large open field areas between and surrounding active diffusion regions 12 and 14.

Referring next to Prior Art FIG. 1B, another schematic top plan view of portion 10 of a semiconductor substrate is shown. In Prior Art FIG. 1B, fill pattern diffusion regions or dummy diffusion regions, typically shown as 18, are formed into the semiconductor substrate. Typically, fill pattern diffusion regions 18 are disposed throughout portion 10 in order to achieve an even or more consistent diffusion pattern density thereon. As with active diffusion regions 12 and 14, it will be understood that during various processing steps, fill pattern diffusion regions 18 are covered by a layer of nitride.

Referring now to FIG. 1C, another schematic top plan view of portion 10 of a semiconductor substrate is shown. In Prior Art FIG. 1C, a polysilicon interconnect line 20 is shown formed over at least one of fill pattern diffusion regions 18. Although fill pattern diffusion regions 18 are intended to improve semiconductor manufacturability processes, conventional fill pattern diffusion region placement methods have severe disadvantages associated therewith. Namely, parasitic capacitance is dramatically increased by having a polysilicon line disposed over fill pattern diffusion regions. Thus, polysilicon line 20 will experience substantial parasitic capacitance by virtue of being disposed over fill pattern diffusion regions 18. This parasitic capacitance results in slower signal line speeds due to RC (resistance-capacitance) effects. Unfortunately, conventional fill pattern generator and layout editor systems frequently locate fill pattern diffusion regions such that they underlie polysilicon interconnect lines.

With reference next to Prior Art FIG. 2, a side sectional view of portion 10 of Prior Art FIG. 1C taken along line A—A is shown. Polysilicon interconnect line 20 is separated from fill pattern diffusion region 18 by only a thin gate oxide layer 22. Typically, gate oxide layer 22 has a thickness, t, in the range of approximately 40–80 angstroms. Capacitance, C, experienced by polysilicon line 20 is given by the equation, $C=\epsilon A/d$, where A is the area of the conductive portions separated by dielectric gate oxide 22, $\epsilon$ is the dielectric constant of gate oxide 22, and d is the thickness, t, of gate oxide layer 22. Because the value, d, (i.e. the thickness of the dielectric layer) is in the denominator, with all other values unchanged, the thinner the dielectric layer (i.e. the smaller the value of d), the greater the parasitic capacitance. Thus, it is desirable to have polysilicon line 20 disposed over a dielectric having a greater depth. Therefore, it is desirable to have polysilicon line 20 disposed over trench oxide regions 16 rather than over fill pattern diffusion regions 18.

In one prior art attempt to reduce parasitic capacitance, fill pattern diffusion regions have been "hand-placed" on the semiconductor substrate. Such a prior art method is extremely time-consuming, labor-intensive, and very impractical for large volume applications. For example, in ASIC (application specific integrated circuit) environments, numerous circuit designs may be designed and implemented in relatively short periods of time. In such ASIC environments, hand-placing of fill pattern diffusion regions onto various semiconductor substrates having differing design and layout is not a viable solution.

Thus, a need exists for method to locate fill pattern diffusion regions on a semiconductor such that the fill pattern diffusion regions do not underlie polysilicon interconnect lines. Still another need exists for an method to locate fill pattern diffusion regions such that the fill pattern diffusion regions do not underlie polysilicon interconnect lines wherein the method is automated. Yet another need exists for a method to locate fill pattern diffusion regions on a semiconductor substrate wherein the method can be used with conventional layout editors or fill pattern generation systems.

DISCLOSURE OF THE INVENTION

The present invention provides a method to locate fill pattern diffusion regions on a semiconductor such that the fill pattern diffusion regions do not underlie polysilicon interconnect lines. The present invention also provides a method to locate fill pattern diffusion regions such that the fill pattern diffusion regions do not underlie polysilicon interconnect lines wherein the method is automated. The present invention further provides a method to locate fill pattern diffusion regions on a semiconductor substrate wherein the method can be used with conventional layout editors or fill pattern generation systems.

Specifically, in one embodiment, the present invention determines the locations of active diffusion regions on a semiconductor substrate. The present invention also determines the locations of interconnect lines on the semiconductor substrate. Next, the present invention creates a union of the location of the active diffusion regions on the semiconductor substrate and the location of the interconnect lines on the semiconductor substrate. The present invention uses this union to define allowable locations for placement of fill pattern diffusion regions on the semiconductor substrate such that the fill pattern diffusion regions are not disposed under the interconnect lines.

In another embodiment, the present invention employs the above-described steps and then uses the union of the location of the active diffusion regions on the semiconductor substrate and the location of the interconnect lines on the semiconductor substrate to generate a diffusion mask layer. The diffusion mask layer is then used to locate the active diffusion regions, the interconnect lines, and the fill pattern diffusion regions on the semiconductor substrate such that the fill pattern diffusion regions do not underlie the interconnect lines.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

Prior Art

Prior Art

BEST MODE FOR CARRYING OUT THE INVENTION

Figure 1C:
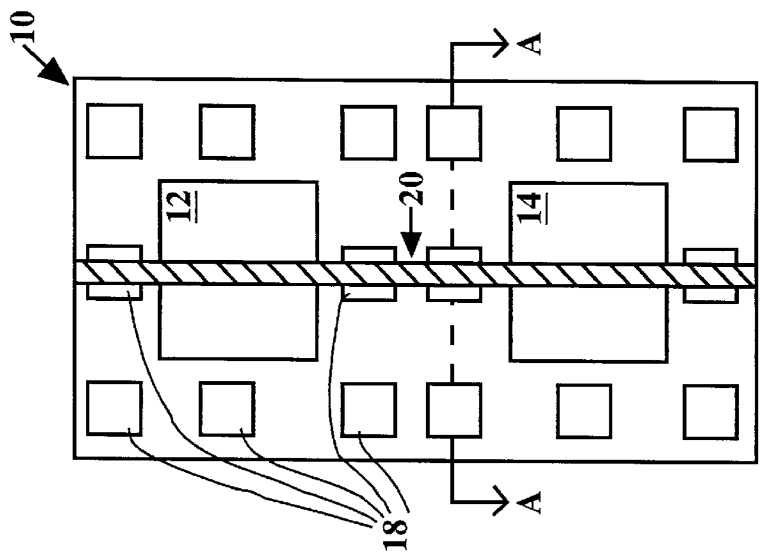
FIG. 1C is schematic top plan view of the portion of Prior Art FIG. 1B having polysilicon interconnect lines formed over the fill pattern diffusion regions or dummy diffusion regions.
Figure 1B:
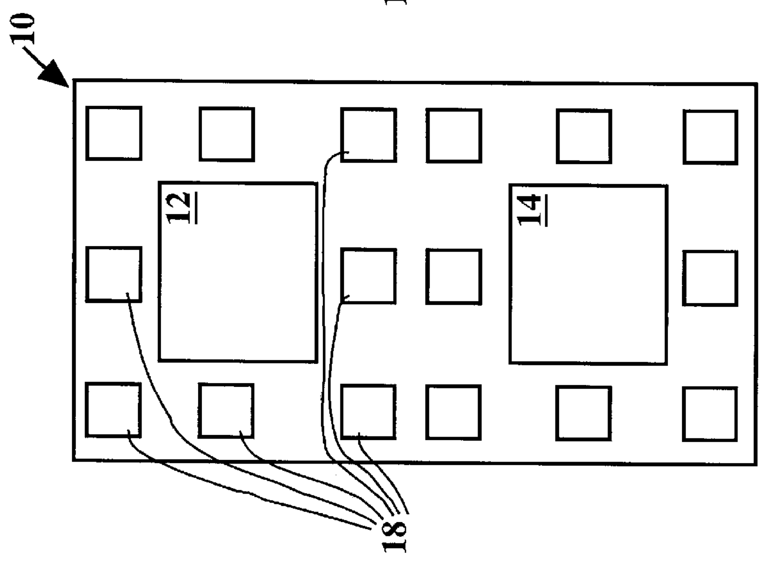
FIG. 1B is schematic top plan view of the portion of Prior Art FIG. 1A having fill pattern diffusion regions or dummy diffusion regions formed therein.
Figure 1A:
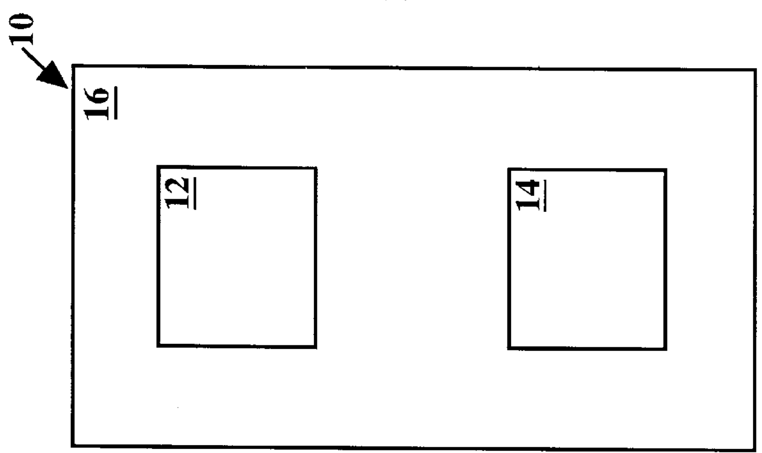
FIG. 1A is a schematic top plan view of a portion of a semiconductor substrate having active diffusion regions formed therein.
Figure 2:
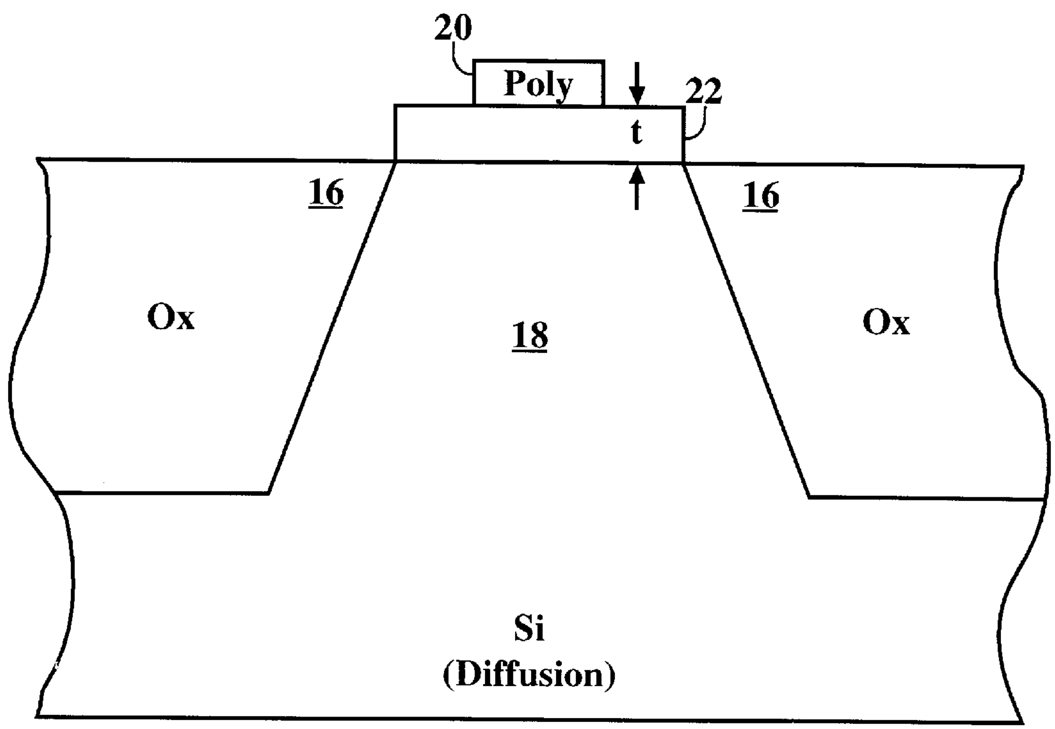
FIG. 2 is a side sectional view of the portion of Prior Art FIG. 1C taken along line A—A of Prior Art FIG. 1C showing a polysilicon interconnect line disposed over a fill pattern diffusion region.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope or the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proved convenient at times, principally for reasons of common usage, to refer to these signals as bits, values, elements, symbols, characters, terms, numbers, or the like.

It should be borne in mind, however, that all of these and similar terms are to be associated with the appropriate-physical quantities and are merely convergent labels applied to these quantities. Unless specifically stated otherwise as apparent from the following discussions, it is appreciated that throughout the present invention, discussions utilizing terms such as "determining", "creating", "utilizing", "using", or the like, refer to the actions and processes of a computer system, or similar electronic computing device. The computer system or similar electronic computing device manipulates and transforms data represented as physical (electronic) quantities within the computer system's registers and memories into other data similarly represented as physical quantities within the computer system memories or registers or other such information storage, transmission, or display devices. The present invention is also well suited to the use of other computer systems such as, for example, optical and mechanical computers.

COMPUTER SYSTEM ENVIRONMENT OF THE PRESENT INVENTION

Figure 3:
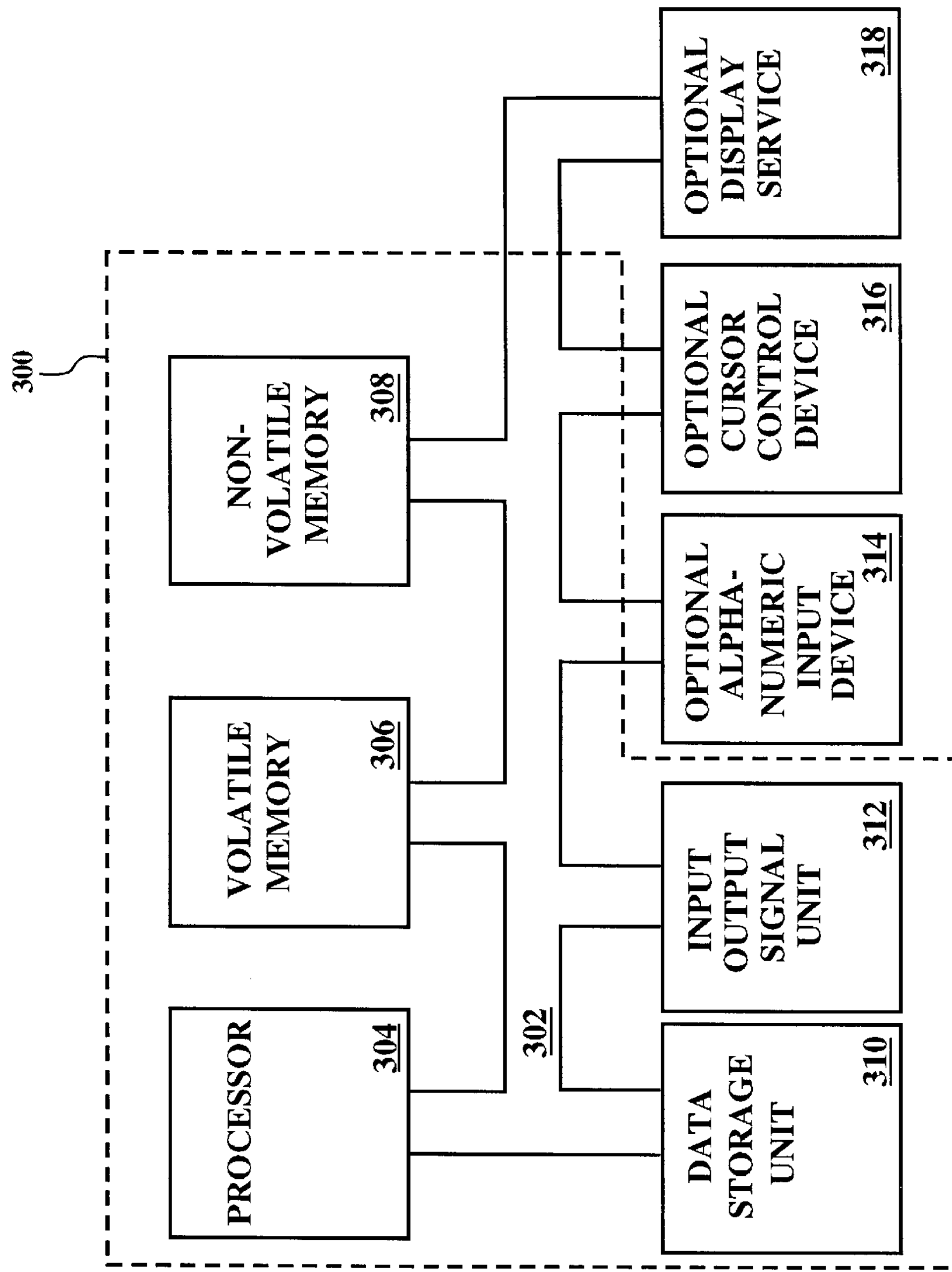
FIG. 3 is a schematic diagram of an exemplary computer system used to perform the low capacitance diffusion pattern method in accordance with one embodiment of the present invention.

With reference now to FIG. 3, portions of the present low capacitance diffusion pattern filling method are comprised of computer-readable and computer-executable instructions which reside, for example, in computer-usable media of a computer system. FIG. 3 illustrates an exemplary computer system 300 used to perform the low capacitance diffusion pattern method in accordance with one embodiment of the present invention. It is appreciated that system 300 of FIG. 3 is exemplary only and that the present invention ran operate within a number of different computer systems including general purpose computers systems, embedded computer systems, and stand alone layout editors or automated pattern generator computer systems specially adapted for locating diffusion fill patterns.

System 300 of FIG. 3 includes an address/data bus 302 for communicating information, and a central processor unit 304 coupled to bus 302 for processing information and instructions. System 300 also includes data storage features such as a computer usable volatile memory 306, e.g. random access memory (RAM), coupled to bus 302 for storing information and instructions for central processor unit 304, computer usable non-volatile memory 308, e.g. read only memory (ROM), coupled to bus 302 for storing static information and instructions for the central processor unit 304, and a data storage device 310 (e.g., a magnetic or optical disk and disk drive) coupled to bus 302 for storing information and instructions. A signal input output comm device 312 (e.g. a modem) coupled to bus 302 is also included in system 300 of FIG. 3. System 300 of the present invention also includes an optional alphan-meric input device 314 including alphanumeric and function keys is coupled to bus 302 for communicating information and command selections to central processor unit 304. System 300 also optionally includes a cursor control device 316 coupled to bus 302 for communicating user input information and command selections to central processor unit 304. System 300 of the present embodiment also includes an optional display device 318 coupled to bus 302 for displaying information.

Display device 318 of FIG. 3, utilized with the present diffusion pattern filling method, may be a liquid crystal device, cathode ray tube, or other display device suitable for creating graphic images and alphanumeric characters recognizable to a user. Optional cursor control device 316 allows the computer user to dynamically signal the two dimensional movement of a visible symbol (cursor) on a display screen of display device 318. Many implementations of cursor control device 316 are known in the art including a trackball, mouse, touch pad, joystick or special keys on alphanumeric input device 314 capable of signaling movement of a given direction or manner of displacement. Alternatively, it will be appreciated that a cursor can be directed and/or activated via input from alphanumeric input device 314 using special keys and key sequence commands. The present invention is also well suited to directing a cursor by other means such as, for example, voice commands. A more detailed discussion of the present low capacitance diffusion pattern filling method is found below.

GENERAL DESCRIPTION OF THE PRESENT LOW CAPACITANCE DIFFUSION PATTERN FILLING METHOD

Figure 4:
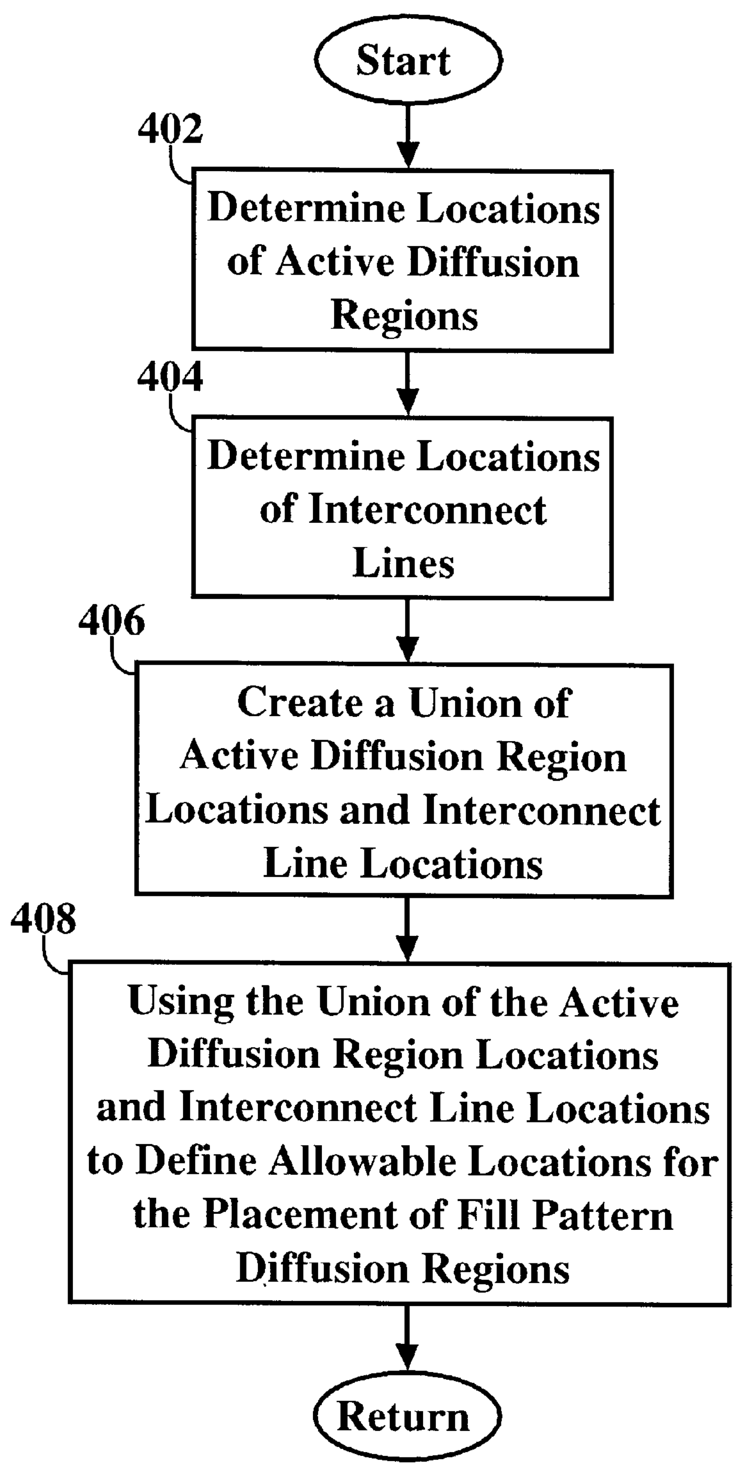
FIG. 4 is a flow chart of steps performed in accordance with one embodiment of the present claimed invention.

With reference next to FIG. 4, a flow chart 400 of steps used by the present low capacitance diffusion pattern filling method is shown. Flow chart 400 includes processes of the present invention which, in one embodiment, are carried out by a processor under the control of computer-readable and computer-executable instructions. The computer-readable and computer-executable instructions reside, for example, in data storage features such as computer usable volatile memory 308 and/or computer usable non-volatile memory 308 of FIG. 3. The computer-readable and computer-executable instructions are used to control, for example, the operation and functioning of central processing unit 304 of FIG. 3. The steps of FIG. 4 will be described in conjunction with FIG. 5A–5E, and FIG. 6.

Figure 5C:
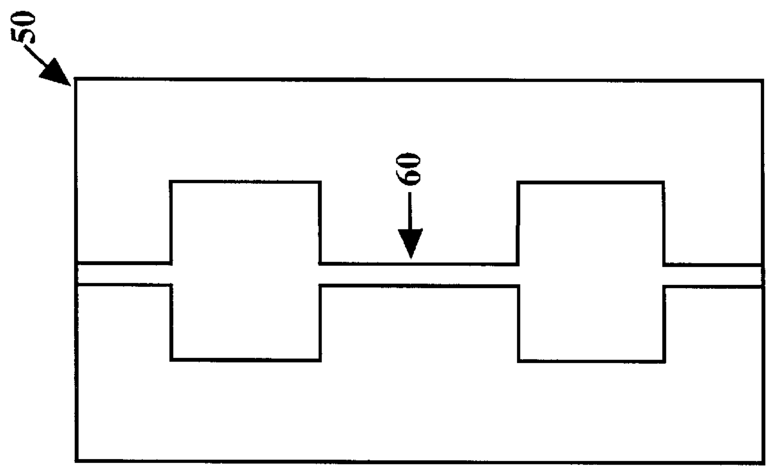
FIG. 5C is schematic top plan view of the union of the polysilicon line and the active diffusion regions of FIGS. 5A and 5B, respectively, in accordance with one embodiment of the present claimed invention.
Figure 5B:
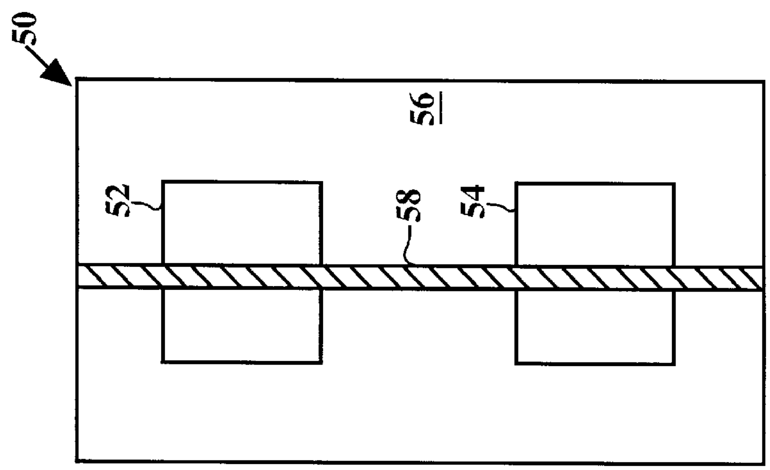
FIG. 5B is schematic top plan view of the portion of FIG. 5A having a polysilicon interconnect line superimposed thereon in accordance with one embodiment of the present claimed invention.
Figure 5A:
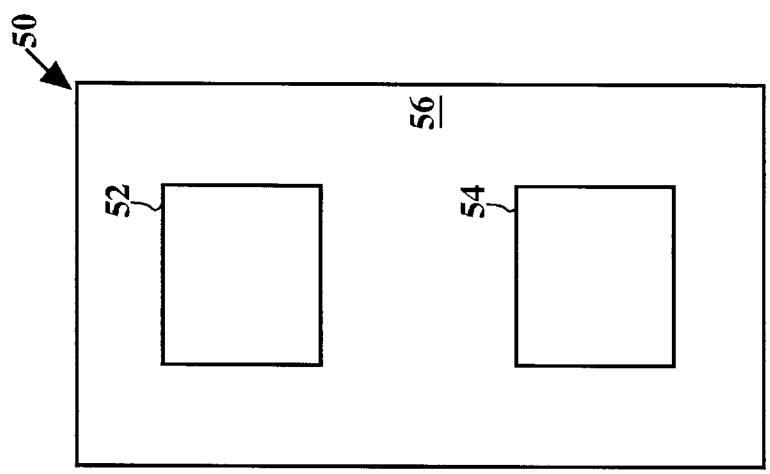
FIG. 5A is a schematic top plan view of a portion of a semiconductor substrate having active diffusion regions formed therein in accordance with one embodiment of the present claimed invention.

With reference again to FIG. 4, in step 402 the present invention determines the location of active diffusion regions on a semiconductor substrate. FIG. 5A provides a schematic top plan view of a portion 50 of a semiconductor substrate having active diffusion regions 52 and 54 formed therein. Active diffusion regions 52 and 54 are separated by oxide 56. Oxide 56 is formed or deposited into the semiconductor substrate by, for example, a shallow trench isolation process. It will be understood that during various processing steps, active diffusion regions 52 and 54 are covered by a layer of nitride. In one embodiment, the present invention determines the location of the active diffusion regions in a two step process. That is, the present invention first determines the location of active diffusion regions of a first conductivity type on the semiconductor substrate, and then determines the location of active diffusion regions of a second conductivity type on the semiconductor substrate. The first and second conductivity types are comprised, for example, of n-type and p-type conductivity regions, respectively.

Referring now to step 404 of FIG. 4, the present invention then determines the location where polysilicon interconnect lines will be disposed on the semiconductor substrate. As shown in FIG. 5B, a typical polysilicon interconnect line 58 used, for example, to electrically couple active diffusion region 52 to active diffusion region 54 is shown disposed on semiconductor portion 50.

Next, as stated in step 406, the present invention creates a union of the location of the active diffusion regions on the semiconductor substrate and the location of at which polysilicon interconnect lines are to be disposed on the semiconductor substrate. In the present embodiment, the union is created by logically ORing the location of the active diffusion regions on the semiconductor substrate with the location of at which polysilicon interconnect lines are to be disposed on the semiconductor substrate. FIG. 5C illustrates the union 58 of the location of the active diffusion regions 52 and 54 on the semiconductor substrate 50 with the location of at which polysilicon interconnect line 60 to be disposed on the semiconductor substrate 50.

Figure 5E:
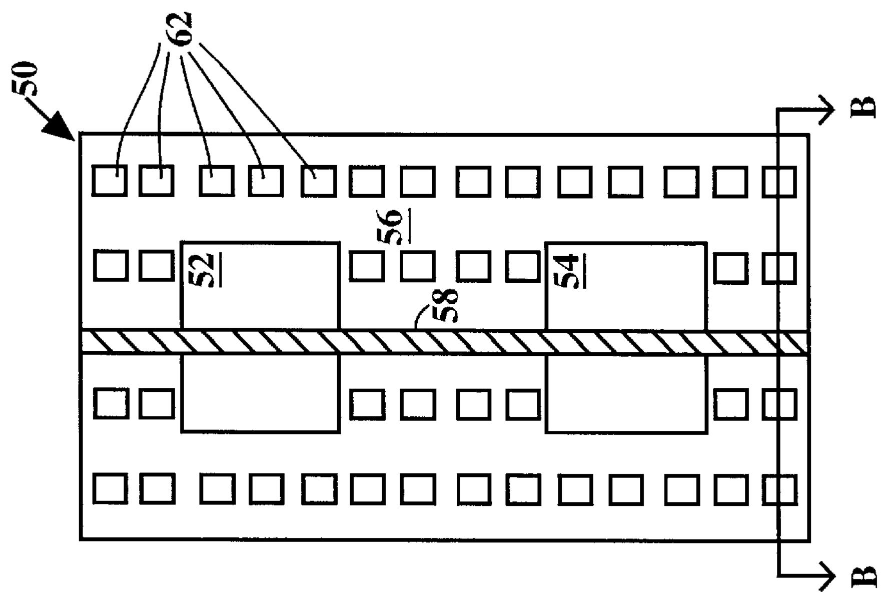
FIG. 5E schematic top plan view of a portion of a semiconductor substrate having a polysilicon interconnect line disposed thereon such that the polysilicon line does not reside over the fill pattern diffusion regions or dummy diffusion regions in accordance with one embodiment of the present claimed invention.
Figure 5D:
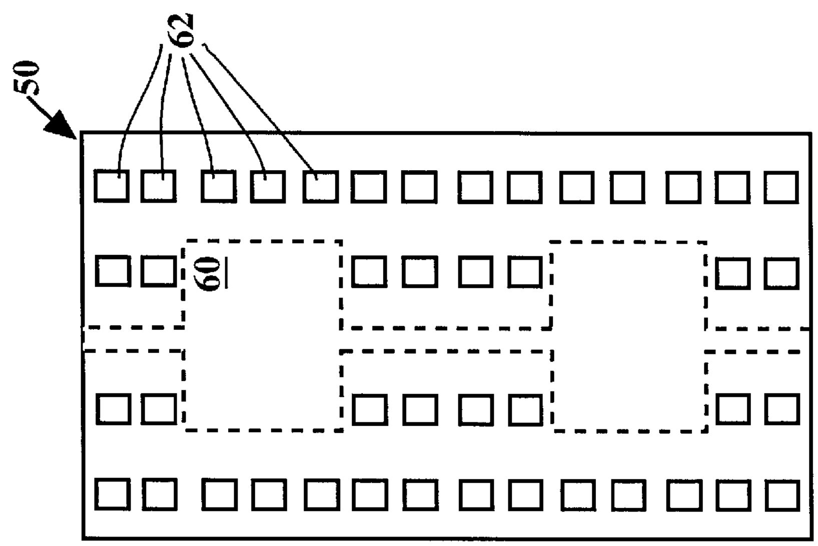
FIG. 5D is schematic top plan view of a portion of a semiconductor substrate having fill pattern diffusion regions or dummy diffusion regions disposed around the union of the polysilicon line and the active diffusion regions of FIG. 5C in accordance with one embodiment of the present claimed invention.

With reference next to step 408 of FIG. 4, the present invention utilizes the union created in step 406 to define allowable locations for placement of fill pattern diffusion regions on the semiconductor substrate. For purposes of the present invention, allowable locations are defined as those locations which are outside of the union formed by the present invention in step 408. In so doing, the present invention insures that the fill pattern diffusion regions are not disposed under the interconnect line. As shown in FIG. 5D, the present invention utilizes union 60 to define allowable fill pattern diffusion region locations on semiconductor portion 50. Fill pattern diffusion regions or dummy diffusion regions, typically shown as 62, are formed into the semiconductor substrate surrounding but not intersecting union 60, as shown in FIG. 5E. As with active diffusion regions 52 and 54, it will be understood that during various processing steps, fill pattern diffusion regions 62 are covered by a layer of nitride. By restricting the location of fill pattern diffusion regions 62, the present invention eliminates parasitic capacitance associated with prior art fill pattern diffusion region placement techniques. That is, the present invention eliminates unwanted RC (resistance-capacitance) effects and subsequent slower signal line speeds resulting from prior art fill pattern diffusion region placement methods.

Additionally, in one embodiment, the union created by the present invention is utilized by an automated pattern generator to define allowable locations for placement of the fill pattern diffusion regions on the semiconductor substrate. That is, a layout editor or automated pattern generator uses the union as a guide when placing fill pattern diffusion regions onto the semiconductor substrate. Thus, the present invention is compatible with existing conventional automated layout editors or fill pattern generation systems. By being well suited for such automated use, the present invention eliminates the need for costly and time-consuming hand placement of fill pattern diffusion regions onto the semiconductor substrate.

In yet another embodiment, the present invention utilizes union 60 to generate a diffusion pattern mask for selectively locating fill pattern diffusion regions on a semiconductor substrate. In such an embodiment, the diffusion pattern mask is created such that the fill pattern diffusion regions formed into the semiconductor substrate do not underlie any interconnect lines.

Figure 6:
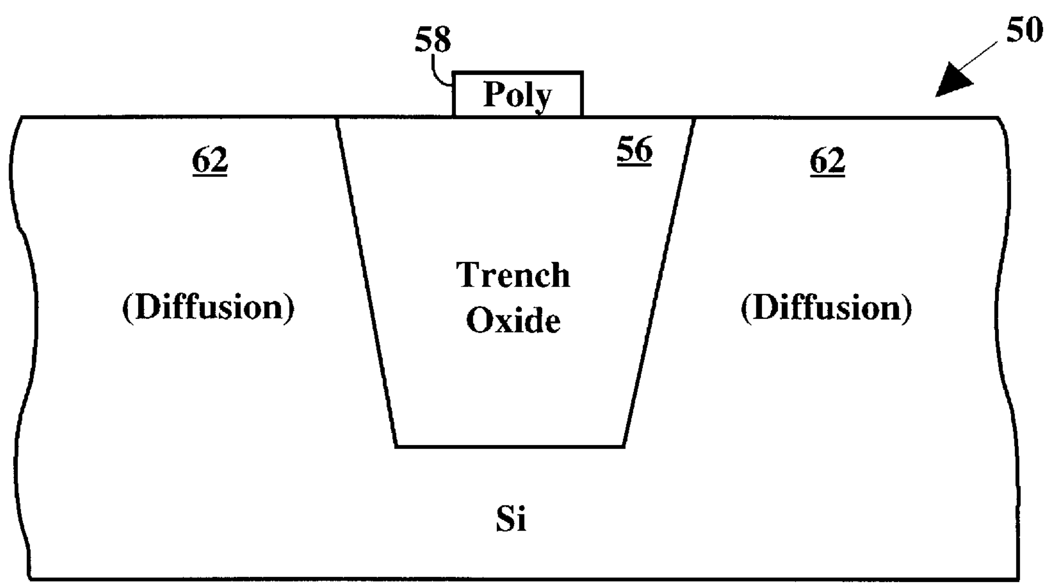
FIG. 6 is a side sectional view of the portion of FIG. 5E taken along line B—B of FIG. 5E showing a polysilicon interconnect line disposed over a thick trench oxide region in accordance with one embodiment of the present claimed invention.

With reference next to FIG. 6, a side sectional view of portion 50 of FIG. 5E taken along line B—B is shown. Polyslicon interconnect line 58 is separated from the semiconductor substrate 50 by the thick trench oxide region 56. Typically, trench oxide region 56 has a thickness, T, in the range of approximately 3000–4500 angstroms. Capacitance, C, experienced by polysilicon line 58 is given by the equation, $C=\epsilon A/d$, where A is the area of the conductive portions separated by thick trench oxide region 56, $\epsilon$ is the dielectric constant of thick trench oxide 56, and d is the thickness, T, of thick trench oxide region 56 Because the value, d, (i.e. the thickness of the dielectric layer) is in the denominator, with all other values unchanged, the thicker the dielectric layer (i.e. the greater the value of d), the lesser the parasitic capacitance. Thus, it is desirable to have polysilicon line 58 disposed over a thick dielectric. Therefore, the present invention advantageously disposes polysilicon line 58 over thick trench oxide region 56, thereby providing a reduced parasitic capacitance compared to parasitic capcitances associated with the prior art.

Thus, the present invention provides a method to locate fill pattern diffusion regions on a semiconductor such that the fill pattern diffusion regions do not underlie polysilicon interconnect lines. The present invention also provides a method to locate fill pattern diffusion regions such that the fill pattern diffusion regions do not underlie polysilicon interconnect lines wherein the method is automated. The present invention further provides a method to locate fill pattern diffusion regions on a semiconductor substrate wherein the method can be used with conventional layout editors or fill pattern generation systems.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. An automated method for selectively locating fill pattern diffusion regions on a semiconductor substrate, the method comprising the steps of:

a) determining the location of active diffusion regions on a semiconductor substrate;

b) determining the location of interconnect lines on said semiconductor substrate;

c) creating a union of said location of said active diffusion regions on said semiconductor substrate and said location of said interconnect lines on said semiconductor substrate; and d) utilizing said union created in step c) to define allowable locations for placement of fill pattern diffusion regions on said semiconductor substrate such that said fill pattern diffusion regions are not disposed under said interconnect lines said fill pattern diffusion regions adapted to provide a more consistent diffusion pattern density and said fill pattern diffusion regions adapted to enhance planarity in subsequent planarization processes.

2. The automated method for selectively locating fill pattern diffusion regions on a semiconductor substrate as recited in claim 1 wherein step a) further comprises the steps of:

a1) determining the location of active diffusion regions of a first conductivity type on said semiconductor substrate; and a2) determining the location of active diffusion regions of a second conductivity type on said semiconductor substrate.

3. The automated method for selectively locating fill pattern diffusion regions on a semiconductor substrate as recited in claim 1 wherein step c) further comprises:

creating said union by logically ORing said location of said active diffusion regions on said semiconductor substrate and said location of said interconnect lines on said semiconductor substrate.

4. The automated method for selectively locating fill pattern diffusion regions on a semiconductor substrate as recited in claim 1 wherein step d) further comprises:

utilizing said union created in step c) in an automated pattern generator to define said allowable locations for placement of said fill pattern diffusion regions on said semiconductor substrate such that said fill pattern diffusion regions are not disposed, by said automated pattern generator, under said interconnect lines.

5. A method for generating a diffusion pattern mask which selectively locates fill pattern diffusion regions on a semiconductor substrate, the diffusion pattern mask generation method comprising the steps of:

a) determining the location of active diffusion regions on a semiconductor substrate;

b) determining the location of interconnect lines on said semiconductor substrate;

c) creating a union of said location of said active diffusion regions on said semiconductor substrate and said location of said interconnect lines on said semiconductor substrate;

d) utilizing said union created in step c) to determine allowable locations for placement of fill pattern diffusion regions on said semiconductor substrate such that said fill pattern diffusion regions are not disposed under said interconnect lines; and e) using said union created in step c) and said allowable locations determined in step d) to generate a diffusion mask layer wherein said diffusion mask layer locates said active diffusion regions, said interconnect lines, and said fill pattern diffusion regions on said semiconductor substrate such that said fill pattern diffusion regions do not underlie said interconnect lines said fill pattern diffusion regions adapted to provide a more consistent diffusion pattern density and said fill pattern diffusion regions adapted to enhance planarity in subsequent planarization processes.

6. The method for generating a diffusion pattern mask as recited in claim 5 wherein step a) further comprises the steps of:

a1) determining the location of active diffusion regions of a first conductivity type on said semiconductor substrate; and a2) determining the location of active diffusion regions of a second conductivity type on said semiconductor substrate.

7. T he method for generating a diffusion pattern mask as recited in claim 5 wherein step c) further comprises the steps of:

creating said union by logically ORing said location of said active diffusion regions on said semiconductor substrate and said location of said interconnect lines on said semiconductor substrate.

8. The method for generating a diffusion pattern mask as recited in claim 5 wherein step d) further comprises the steps of:

utilizing said union created in step c) in an automated pattern generator to define said allowable locations for placement of said fill pattern diffusion regions on said semiconductor substrate such that said fill pattern diffusion regions are not disposed, by said automated pattern generator, under said interconnect lines.

* * * * *